(12) United States Patent
Nguyen et al.

(10) Patent No.: US 8,698,186 B2
(45) Date of Patent: Apr. 15, 2014

(54) CIRCUIT BOARD WITH THERMO-CONDUCTIVE PILLAR

(75) Inventors: Lac Nguyen, Markham (CA); Chang Han, Pleasanton, CA (US)

(73) Assignee: Cofan USA, Inc., Fremont, CA (US)

( * ) Notice: Subject to any disclaimer, the term of this patent is extended or adjusted under 35 U.S.C. 154(b) by 318 days.

(21) Appl. No.: 13/186,461

(22) Filed: Jul. 19, 2011

(65) Prior Publication Data

US 2013/0020606 A1    Jan. 24, 2013

(51) Int. Cl.
 *H01L 33/62* (2010.01)
(52) U.S. Cl.
 USPC .......... 257/99; 438/22; 257/E33.066
(58) Field of Classification Search
 USPC .......... 257/99, E33.066; 29/829; 174/261; 438/22
 See application file for complete search history.

(56) References Cited

U.S. PATENT DOCUMENTS

| | | | |
|---|---|---|---|
| 4,509,096 A * | 4/1985 | Baldwin et al. | 361/719 |
| 5,220,487 A * | 6/1993 | Patel et al. | 361/708 |
| 7,607,800 B2 | 10/2009 | Park | |
| 8,314,472 B2 * | 11/2012 | Parkhurst et al. | 257/499 |
| 2004/0228113 A1 | 11/2004 | Wang | |

FOREIGN PATENT DOCUMENTS

| | | |
|---|---|---|
| TW | 591997 | 1/1992 |
| TW | 591980 | 5/1992 |
| TW | I333576 | 8/1994 |
| TW | P6137311 | 10/1996 |

* cited by examiner

*Primary Examiner* — Roy Potter
(74) *Attorney, Agent, or Firm* — Alston & Bird LLP

(57) ABSTRACT

An LED device with improved circuit board LED support structure is presented. A top surface of a thermally-conductive substrate of this LED device comprises a thermally-conductive pillar. The pillar is not covered with a dielectric layer and an LED package is arranged directly on the pillar with the LED packages bottom thermally-conductive plate in direct contact with the pillar top surface.

19 Claims, 8 Drawing Sheets

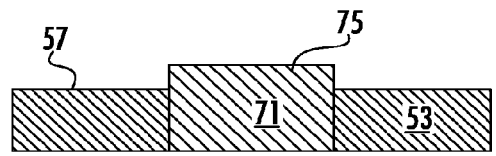
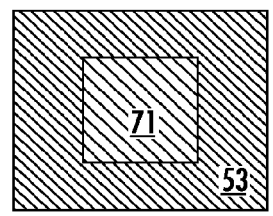
FIG. 19A  FIG. 19B
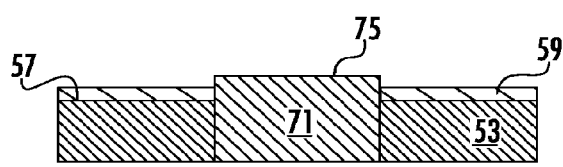
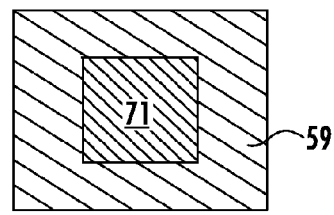
FIG. 20A  FIG. 20B
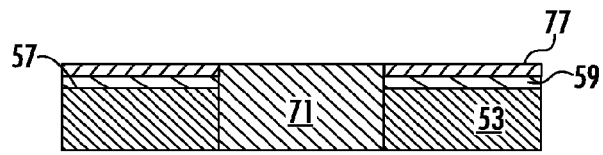
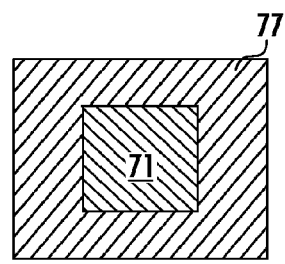
FIG. 21A  FIG. 21B
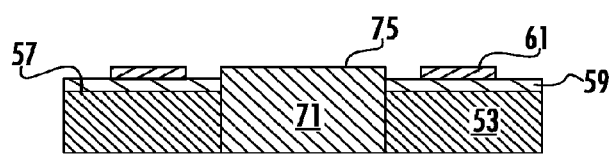
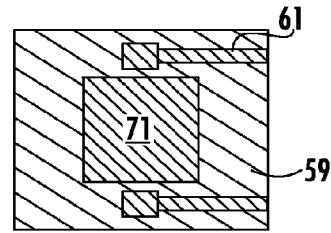
FIG. 22A  FIG. 22B

CIRCUIT BOARD WITH THERMO-CONDUCTIVE PILLAR

FIELD

The example embodiments of the present invention pertain generally to devices comprising light-emitting diodes (LEDs), including devices comprising surface-mounted LEDs.

BACKGROUND

Light-emitting diodes (LEDs) are widely used as a semiconductor lighting source. Generally an LED die is packaged by attaching it to a dielectric substrate, wire-bonding it to electrodes pre-installed on the substrate surface, and covering it with an epoxy "glob-top" to protect the LED die from mechanical damage and contamination, and to improve the LED radiation angle.

Performance of an LED is sensitive to the temperature of the operating environment. When an LED operates in high ambient temperatures, it can overheat and eventually malfunction or fail. The LED efficiency can be increased by improving thermal dissipation from the LED die. This can be achieved by the use of a circuit board with a high thermally-conductive substrate, such as a Metal Core Printed Circuit Board (MCPCB).

The circuit board thermal dissipation can also be increased by providing a metal pad on the circuit board surface and/or providing a metal plate on the bottom of the LED package. In this regard, the LED package may be placed directly on the circuit board so that it is in direct contact with a circuit board metal pad. Additionally or alternatively, the LED package may have a metal plate and be placed directly on the circuit board so that the LED package metal plate is in direct contact with the dielectric layer.

FIG. 1 depicts a prior-art circuit board structure 1 to support an LED package. A metal substrate 2 is covered with a dielectric layer 3. Electrode pads and conductive leads 5 are formed over the dielectric layer 3. A thermally-conductive LED pad 7 is positioned on the dielectric layer 3 to have direct physical contact with the bottom of the LED package.

FIG. 2 depicts an LED package 9 having an LED die 11 wire-bonded by wires 13 to pre-installed electrodes 15. The LED die 11 is positioned on a dielectric substrate 17 that has a metal plate 19 attached to its bottom. An optical lens 21 covers the LED die 11 and the wires 13.

FIG. 3 depicts a combination of the LED package 9 with the circuit board structure 1. The LED package 9 is positioned on the circuit board structure 1 so that the metal plate 19 is in direct contact with the metal pad 7. The electrodes 15 are soldered to the electrode pads 5. In this prior art device, however, the dielectric layer 3 separates the metal plate 7 from the metal substrate 2 and interferes with temperature exchange.

BRIEF SUMMARY

In view of the foregoing, example embodiments of the present invention provide LED devices with improved LED efficiency and methods for making the same. The circuit board LED support systems of example embodiments of the present invention have a pillar with high thermal conductivity positioned in direct contact with both a circuit board substrate (also having high thermal conductivity) and the LED package.

In some example embodiments, the pillar is formed by pre-shaping the substrate. In other example embodiments, the pillar is a metal mesa-shaped structure formed on the top surface of the substrate. In other example embodiments, the pillar is formed by a metal column inserted into an opening in the substrate. The column is longer than the thickness of the substrate, and the end of the column sticks out above the top surface of the substrate forming the pillar.

In some example embodiments, the bottom surface of the substrate is flattened by filling a pocket underneath the pillar with a material of high thermal conductivity.

This pillar improves temperature control efficiency of the LED device of the present invention.

BRIEF DESCRIPTION OF THE SEVERAL VIEWS OF THE DRAWING(S)

Having thus described the example embodiments of the present invention in general terms, reference will now be made to the accompanying drawings, which are not necessarily drawn to scale, and wherein:

FIGS. 9*a-e* depict steps in the assembly of the device of an example embodiment of the present invention.

FIGS. 10*a-f* depict steps in the assembly of the device of another example embodiment of the present invention.

FIGS. 11-15 depict steps in the assembly of the device of another example embodiment of the present invention.

FIGS. 16-22 depict steps in the assembly of the device of another example embodiment of the present invention.

Figure 23:
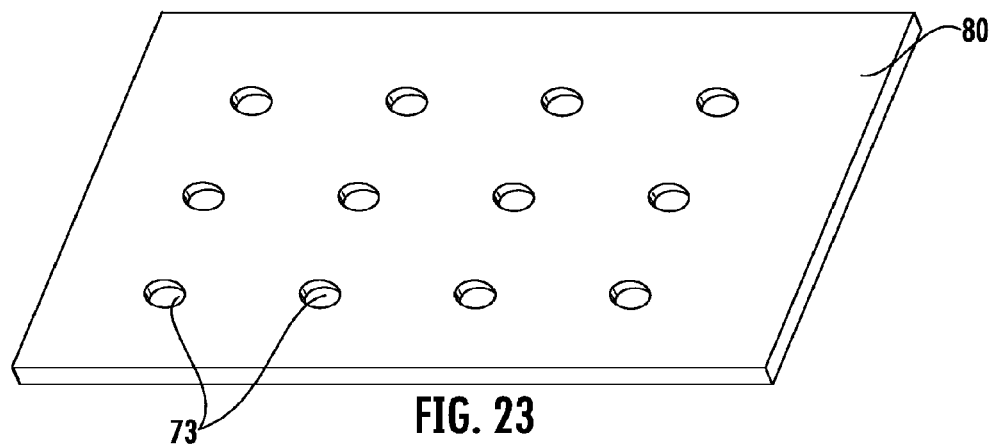
Figure 23A:

FIG. 23 depicts an isometric view of the substrate for another example embodiment of the present invention.

DETAILED DESCRIPTION

The present disclosure now will be described more fully with reference to the accompanying drawings, in which some, but not all embodiments of the disclosure are shown. This disclosure may be embodied in many different forms and should not be construed as limited to the embodiments set forth; rather, these example embodiments are provided so that this disclosure will be thorough and complete, and will fully convey the scope of the disclosure to those skilled in the art. Like numbers refer to like elements throughout.

Figure 1:
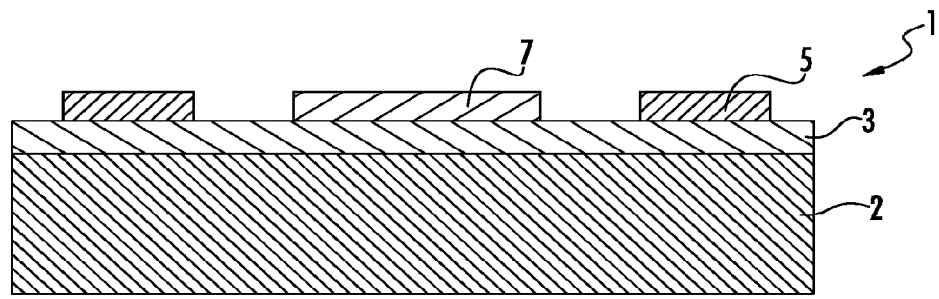
FIG. 1 depicts a cross-section diagram of a prior-art circuit board LED support structure.
Figure 2:
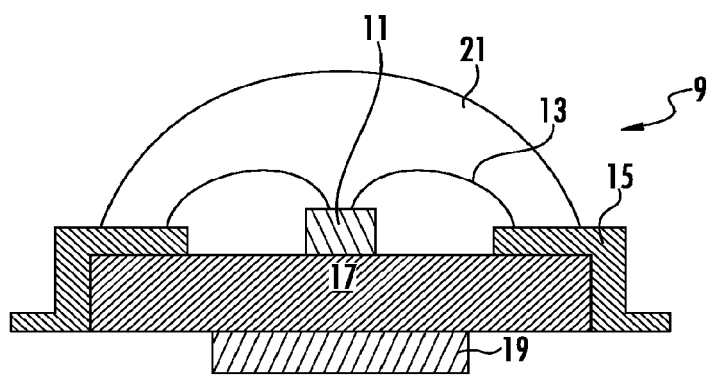
FIG. 2 depicts a cross-section diagram of prior-art LED package.
Figure 3:
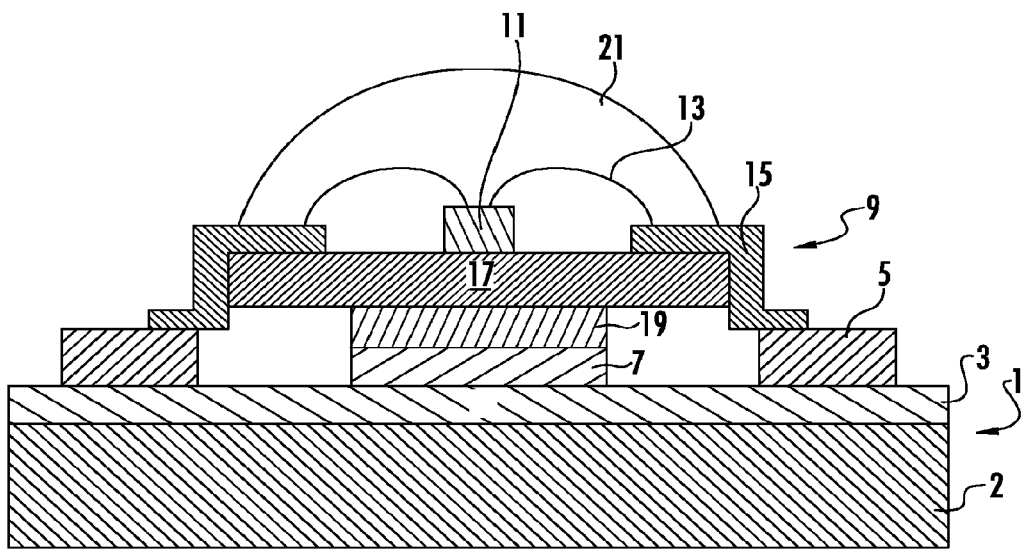
FIG. 3 depicts cross-sectional diagrams of prior art LED device.
Figure 4:
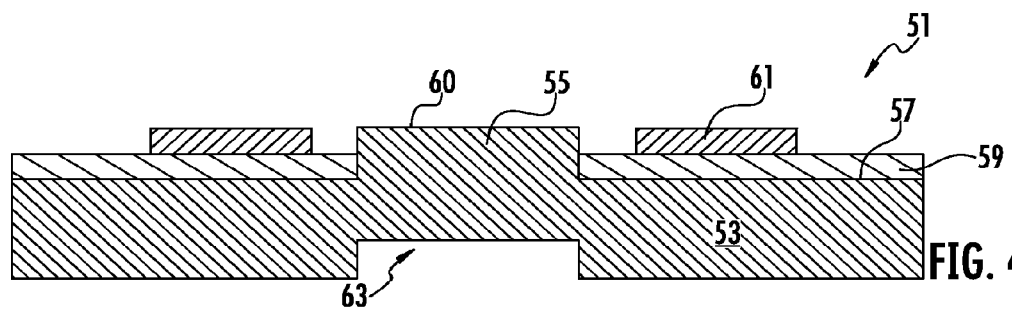
FIGS. 4-7 depict cross-sectional diagrams of the example embodiments of the present invention.

FIG. 4 depicts a circuit board LED support structure 51 according to some example embodiments of the present invention. In some example embodiments, the circuit board is a metal core printed circuit board (MCPCB).

In the example embodiment of FIG. 4, the circuit board LED support structure 51 comprises a substrate 53. In some example embodiments, the substrate 53 is made of a material with high thermal conductivity. In some example embodiments, the substrate 53 is made of a metal, such as aluminum, copper, gold, silver, tungsten, zirconium, or zinc, or an alloy, such as aluminum 2024, aluminum 5052, aluminum 6061, aluminum 7075, aluminum A356, brass yellow, brass red, copper alloy 11000, or a combination thereof. In some example embodiments, the substrate 53 is made of ceramic, such as aluminum nitride, silicon carbide, alumina, or silicon nitride.

In the example embodiment of FIG. 4, the substrate 53 is pre-shaped to have a pillar 55. The pillar 55 is formed by raising one area 60 of the substrate top surface 57 above the rest of the substrate top surface 57. In this example embodiment, the pillar 55 is made of the same material as the substrate 53. In some example embodiments, the pillar is formed by metal punching, such as stamping or rolling, or by other suitable methods. In some example embodiments, during formation of the pillar 55, a pocket 63 forms on the bottom side of the substrate 53 opposite the pillar 55.

In this embodiment, the substrate top surface 57 is at least partially covered with a dielectric layer 59. In some example embodiments, the dielectric layer 59 is made of such electrically-insulating materials as plastic, glass, ceramic, Pre-Preg (glass fiber), fiber, carbon fiber/tube, clad or combination thereof.

The dielectric layer 59 does not cover the area 60 of the substrate top surface 57 which forms the top surface of the pillar 55.

In the example embodiment of FIG. 4, electrode pads and circuit traces 61 are formed on top of the dielectric layer 59. In some example embodiments, the electrode pads and circuit traces 61 are made of a metal, such as aluminum, copper, gold, silver, and conductive inks such as gold, copper, silver particles doped epoxy or a combination thereof.

Figure 5:
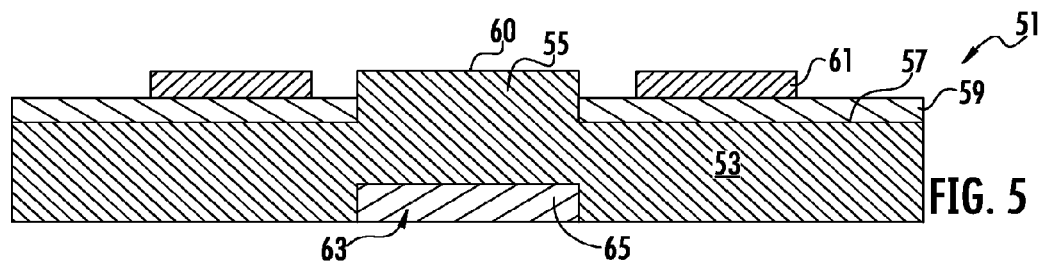

FIG. 5 depicts another example embodiment of the circuit board LED support structure 51. In this embodiment, the pocket 63 is filled. In some example embodiments, the pocket 63 is filled with a material having high thermal conductivity, such as thermal conductive epoxy 65. In other example embodiments, the pocket 63 is filled with thermal conductive paste, such as thermal conductive particles filled silicone paste.

Figure 6:
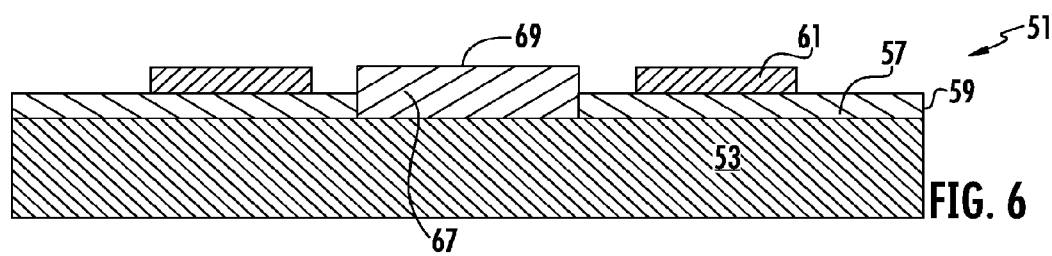

FIG. 6 depicts another example embodiment of the circuit board LED support structure 51. In this embodiment, the pillar is a mesa-shaped structure 67 formed on top of the substrate 53. In some example embodiments the mesa 67 is made of a material with high thermal conductivity. In some example embodiments, the mesa-shaped structure 67 is made of a metal, such as aluminum, copper, gold, silver, tungsten, zirconium, or zinc, or an alloy, such as aluminum 2024, aluminum 5052, aluminum 6061, aluminum 7075, aluminum A356, brass yellow, brass red, copper alloy 11000, or a combination thereof. In some example embodiments, the mesa-shaped structure 67 is made of ceramic, such as aluminum nitride, silicon carbide, alumina, or silicon nitride. In some example embodiments the mesa-shaped structure 67 and the substrate 53 are made of the same material.

In some example embodiments, the mesa-shaped structure 67 is formed by attaching the mesa-shaped structure 67 to the substrate top surface 57. In some example embodiments, the mesa-shaped structure 67 is attached by an adhesive. In other example embodiments, other suitable attachment methods, such as soldering, are used.

In some example embodiments, the mesa-shaped structure 67 is deposited on the substrate top surface 57 by physical deposition. In other example embodiments, the mesa-shaped structure 67 is deposited by chemical deposition. In some example embodiments, the method of depositing the mesa-shaped structure 67 is selected from a group comprising physical vapor deposition (PVD), sputtering, pulse laser deposition, chemical vapor deposition (CVD), plasma-enhanced CVD, plating, chemical solution deposition, e-beam deposition or other methods.

In this embodiment, the dielectric layer 59 at least partially covers the substrate top surface 57 while not covering the mesa top surface 69. The electrode pads and contact leads 61 are formed on top of the dielectric layer 59.

Figure 7:
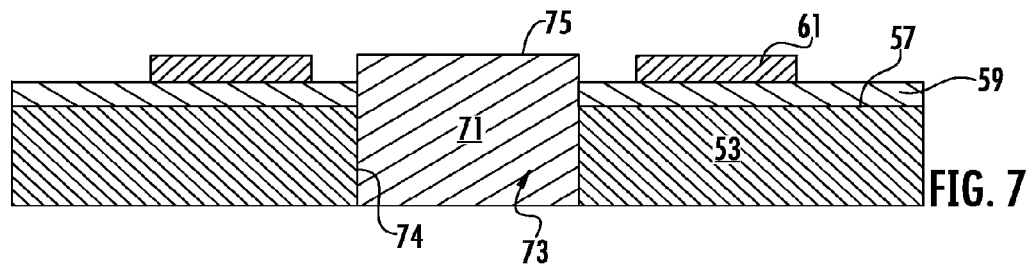

FIG. 7 depicts another example embodiment of the circuit board LED support structure 51. In this embodiment, the substrate 53 has an opening 73 defined by walls 74. The pre-manufactured column 71 is positioned within the opening 73. The height of the column 71 exceeds the thickness of the substrate 53. As a result, a portion of the column 71 is raised above the substrate top surface 57 forming the pillar. In some embodiments, the column 71 has the same profile as the opening 73, the sides of the column 71 touch the opening walls 74 and the column 71 completely closes the opening 73.

In some example embodiments, the column 71 is made of a material with high thermal conductivity. In some example embodiments, the column 71 is made of a metal, such as aluminum, copper, gold, silver, tungsten, zirconium, or zinc, or an alloy, such as aluminum 2024, aluminum 5052, aluminum 6061, aluminum 7075, aluminum A356, brass yellow, brass red, copper alloy 11000, or a combination thereof. In some example embodiments, the column 71 is made of ceramic, such as aluminum nitride, silicon carbide, alumina, or silicon nitride. In some example embodiments the column 71 and the substrate 53 are made of the same material.

The dielectric layer 59 at least partially covers the substrate top surface 57 while not covering the column top surface 75. The electrode pads and contact leads 61 are formed on top of the dielectric layer 59.

Figure 8:
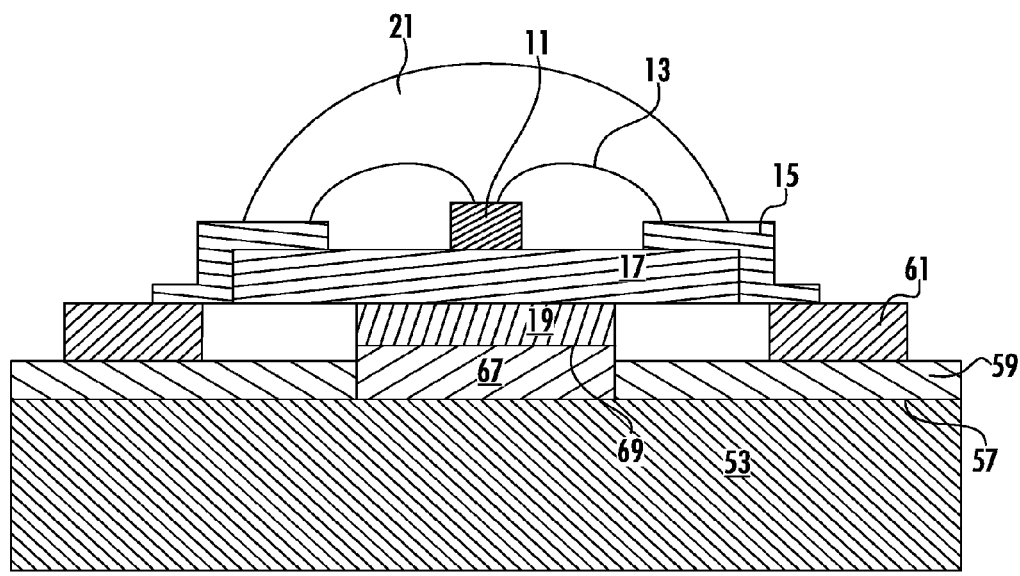
FIG. 8 depicts a cross-sectional diagram of the example embodiment of the present invention with LED package attached.

FIG. 8 depict the example embodiment of the circuit board LED support structure 51 with LED package 9 attached. The metal plate 19 of the LED package 9 is in direct contact with the mesa top surface 69. The electrodes 15 are connected to the electrode pads 61. Since the metal plate 19 and the substrate 53 are in thermal contact through the thermally-conductive mesa-shaped structure 67, the thermal dissipation of the LED die 11 improves.

FIGS. 9a-e show cross-sectional view of some of the steps in a process of assembling the circuit board LED support structure 51 according to an example embodiment of the present invention.

Figure 9A:
Figure 9B:
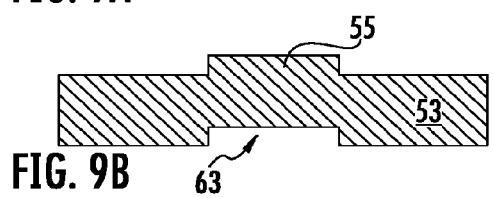

As shown in FIG. 9a, the substrate 53 is obtained. Then, the substrate 53 is reshaped to form a pillar 55, and a pocket 63 forms on the bottom of the substrate 53 (see FIG. 9b). The dielectric layer 59 is formed on the top surface of the substrate 53. The dielectric layer 59 does not cover the pillar 55 (see FIG. 9c). Subsequently, the dielectric layer 59 is covered by a conductive layer 77 (see FIG. 9d), and electrode pads and conductive leads 61 are formed from the conductive layer 77 (see FIG. 9e).

FIGS. 10a-f show cross-sectional view of some of the steps in a process of assembling the circuit board LED support structure 51 according to another example embodiment of the present invention.

Figure 10A:
Figure 10B:
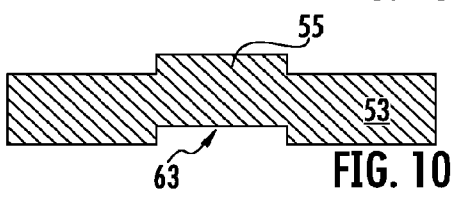
Figure 10C:
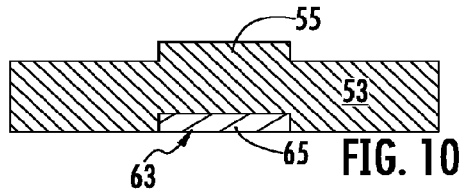
Figure 9C:
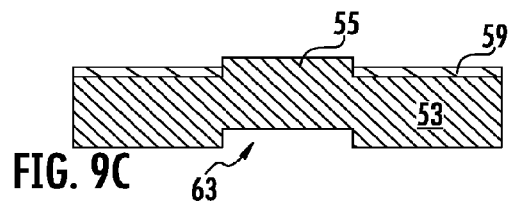
Figure 10D:
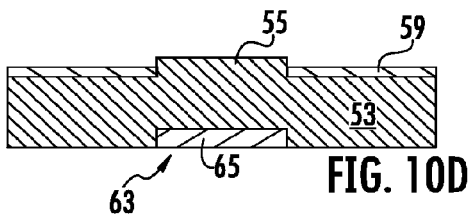
Figure 9D:
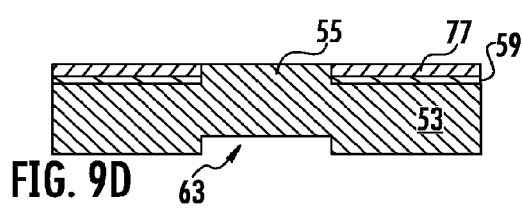
Figure 10E:
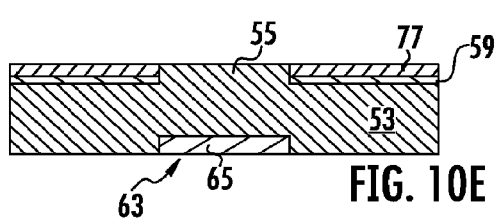
Figure 9E:
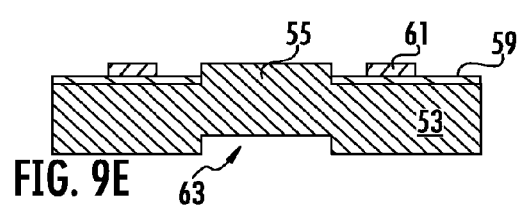
Figure 10F:
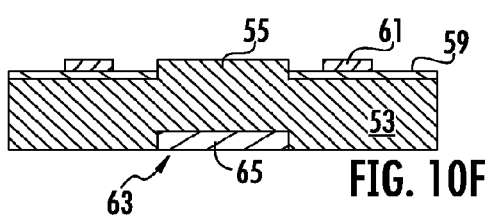

In addition to the steps shown on FIGS. 9a-e, this method also includes the step of filling the pocket 63 with thermally-conductive epoxy 65 (see FIG. 10c).

FIGS. 11-15 show some of the steps in a process of assembling the circuit board LED support structure 51 according to another example embodiment of the present invention. Side views are marked (a) and top views are marked (b).

Figure 11A:
Figure 11B:
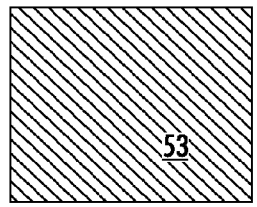
Figure 12A:
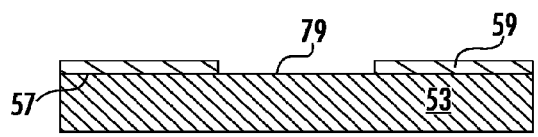
Figure 12B:
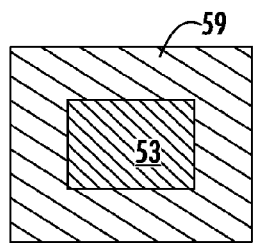
Figure 13A:
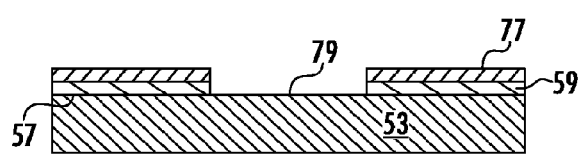
Figure 13B:
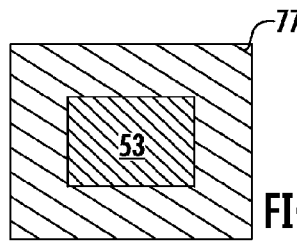

First, the substrate 53 is provided (see FIG. 11). Then, the dielectric layer 59 is formed on the substrate 53 (see FIG. 12). The dielectric layer 59 does not cover an open area 79 of the substrate top surface 57. In the next step, the conductive layer 77 is formed over the dielectric layer 59 (see FIG. 13). The conductive layer 77 also does not cover the open area 79.

Figure 14A:
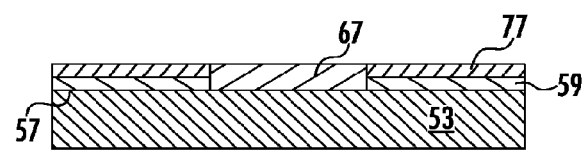
Figure 14B:
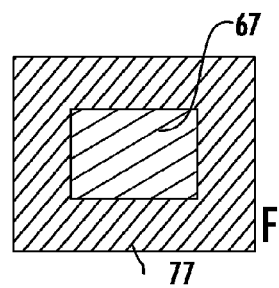
Figure 15A:
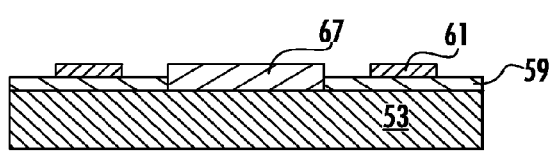
Figure 15B:
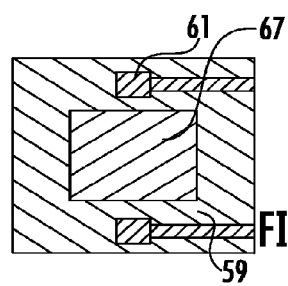

Then, the mesa-shaped structure 67 is formed over the open area 79 filling it in (see FIG. 14). And finally, the electrode pads and conductive leads 61 are formed from the conductive layer 77 (see FIG. 15).

FIGS. 16-23 show some of the steps in a process of assembling the circuit board LED support structure 51 according to yet another example embodiment of the present invention. Side views are marked (a) and top views are marked (b).

Figure 16A:
Figure 16B:
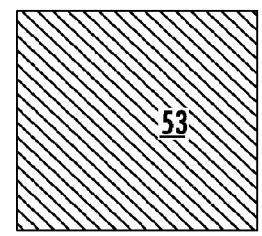
Figure 17A:
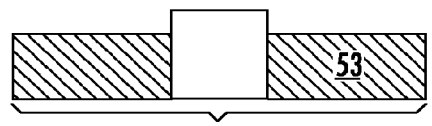
Figure 17B:
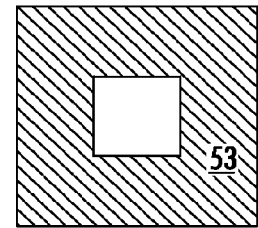
Figure 18A:
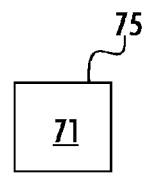
Figure 18B:
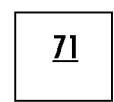

First, the substrate 53 is provided (see FIG. 16). Then, the opening 73 is formed in the substrate 53 (see FIG. 17). The column 71 is formed. The column 71 has the same profile as the opening 73 (see FIG. 18). The height of the column 71 exceeds the thickness of the substrate 53. The column 71 is inserted in the opening 73 so that the sides of the column 71 are in contact with the walls 74 of the opening 73 and the column 71 closes the opening 73 (see FIG. 19). The column 71 is positioned so that the column top surface 75 is raised in relation to the substrate top surface 57. Then, the dielectric layer 59 is formed over the substrate top surface 57 not covering the column top surface 75 (see FIG. 20). The conductive layer 77 covers the dielectric layer 59 (see FIG. 21). Finally, the electrode pads and conductive leads 61 are formed from the conductive layer 77 (see FIG. 22).

In some example embodiments of the present invention, multiple circuit board LED support structures are simultaneously formed on the same substrate. FIG. 23 depicts a substrate 80 having multiple openings 73 where the columns 71 are subsequently inserted.

Many modifications and other example embodiments set forth herein will come to mind to one skilled in the art to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

That which is claimed:

1. A circuit board LED support structure comprising:
a substrate having a substrate top surface and comprising a pillar having a pillar top surface, wherein the pillar top surface is in the plane substantially parallel with the plane of the substrate top surface and is raised in relation to the substrate top surface;
a dielectric layer having dielectric layer top surface and arranged on the substrate top surface, covering at least a portion of the substrate top surface and not covering the pillar top surface; and
electrode pads and circuit traces arranged on the dielectric layer top surface, wherein at least one pocket on a bottom surface of the substrate is filled with thermally-conductive material.

2. The structure of claim 1 wherein the pillar is formed by metal punching.

3. The structure of claim 1 wherein the pillar is formed by attaching a mesa-shaped piece to the substrate.

4. The structure of claim 1 wherein the substrate is metal.

5. The structure of claim 1 wherein the substrate is ceramic.

6. A circuit board LED support structure comprising:
a substrate having a substrate top surface, a substrate bottom surface and walls substantially perpendicular to the substrate top surface and the substrate bottom surface, the walls defining an opening in the substrate;
a column having a column top surface and a column profile substantially the same as the substrate opening, the height of the column exceeding the thickness of the substrate, wherein the column is arranged at least partially in the opening such that at least a top portion of the column is above the substrate top surface and the column top surface is in the plane substantially parallel to the plane of the substrate top surface;
a dielectric layer having dielectric layer top surface and arranged on the substrate top surface, covering at least a portion of the substrate top surface and not covering the column top surface; and
electrode pads and circuit traces arranged on the dielectric layer top surface.

7. The structure of claim 6 wherein the substrate is metal.

8. The structure of claim 6 wherein the substrate is ceramic.

9. The structure of claim 6 wherein the column is metal.

10. The structure of claim 6 wherein the column is ceramic.

11. An LED device comprising:
an circuit board LED support structure comprising:
a substrate having a substrate top surface and comprising a pillar having a pillar top surface, wherein the pillar top surface is in the plane substantially parallel with the plane of the substrate top surface and is raised in relation to the substrate top surface;
a dielectric layer having dielectric layer top surface and arranged on the substrate top surface, covering at least a portion of the substrate top surface and not covering the pillar top surface; and
electrode pads and circuit traces arranged on the dielectric layer top surface; and
an LED package comprising:
an LED die;
LED electrodes; and
LED bottom plate,
wherein the LED package is arranged on the substrate so that the LED bottom plate is in contact with the pillar top surface.

12. A method of forming a circuit board LED support structure comprising:
providing a substrate having a top surface;
shaping substrate to form a pillar having a pillar top surface, wherein the pillar top surface is in a plane substantially parallel with a plane of the substrate top surface and is raised in relation to the substrate top surface;
arranging a dielectric layer having dielectric layer top surface on the substrate top surface, covering at least a portion of the substrate top surface without covering the pillar top surface;
arranging electrode pads and circuit traces on the dielectric layer top surface; and
filling pockets on bottom of the substrate with thermally-conductive material.

13. A method of forming a circuit board LED support structure comprising:
providing a substrate having a top surface;
forming a mesa-shaped piece;
attaching the mesa-shaped piece to the substrate top surface to form a pillar having a pillar top surface in the plane substantially parallel with the plane of the substrate top surface and raised in relation to the substrate top surface;

arranging a dielectric layer having dielectric layer top surface on the substrate top surface, covering at least a portion of the substrate top surface and not covering the pillar top surface; and arranging electrode pads and circuit traces on the dielectric layer top surface.

14. A method of forming a circuit board LED support structure comprising:

providing a substrate having a substrate top surface, a substrate bottom surface and walls substantially perpendicular to the substrate top surface and the substrate bottom surface, the walls defining an opening in the substrate, forming a column having a column top surface and a column profile substantially the same as the substrate opening, the height of the column exceeding the thickness of the substrate;

arranging the column at least partially in the opening such that at least a top portion of the column is above the substrate top surface and the column top surface is in the plane substantially parallel to the plane of the substrate top surface;

arranging a dielectric layer having dielectric layer top surface on the substrate top surface, covering at least a portion of the substrate top surface and not covering the column top surface; and arranging electrode pads and circuit traces on the dielectric layer top surface.

15. The method of claim 14 wherein the substrate is metal.

16. The method of claim 14 wherein the column is metal.

17. The method of claim 14 wherein the substrate is ceramic.

18. The method of claim 14 wherein the column is ceramic.

19. The method of claim 14 further comprising forming a plurality of circuit board LED support structures on the same substrate.

* * * * *